United States Patent
Groves et al.

(10) Patent No.: US 7,273,806 B2
(45) Date of Patent: Sep. 25, 2007

(54) FORMING OF HIGH ASPECT RATIO CONDUCTIVE STRUCTURE USING INJECTION MOLDED SOLDER

(75) Inventors: Robert A. Groves, Highland, NY (US); Peter A. Gruber, Mohegan Lake, NY (US); Kevin S. Petrarca, Newburgh, NY (US); Richard P. Volant, New Fairfield, CT (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 10/905,013

(22) Filed: Dec. 9, 2004

(65) Prior Publication Data

US 2006/0124927 A1 Jun. 15, 2006

(51) Int. Cl.
*H01L 21/44* (2006.01)
(52) U.S. Cl. .................. 438/615; 228/180.22; 228/253; 174/265; 257/E23.023
(58) Field of Classification Search .............. 228/56.3, 228/253, 254, 180.22, 180.21; 174/263, 174/266, 265; 438/612–615, 616; 257/E23.021, 257/E23.023
See application file for complete search history.

(56) References Cited

U.S. PATENT DOCUMENTS 4,412,642 A * 11/1983 Fisher, Jr. ................ 228/173.1
5,211,328 A 5/1993 Ameen et al.
5,718,367 A * 2/1998 Covell et al. ............... 228/254
5,775,569 A 7/1998 Berger et al.
6,029,882 A 2/2000 Bolde et al.
6,133,633 A 10/2000 Berger et al.
6,149,122 A * 11/2000 Berger et al. ............... 249/119
6,294,745 B1 9/2001 Gruber
6,329,631 B1 12/2001 Yueh
6,340,630 B1 * 1/2002 Berger et al. ............... 438/613
6,426,241 B1 7/2002 Cordes et al.
6,454,159 B1 * 9/2002 Takushima .................. 228/253
6,461,136 B1 10/2002 Gruber et al.

OTHER PUBLICATIONS

Ames Laboratory New Release, "Ductile Intermetallic Compounds Discovered: Ames Laboratory Researchers Indentify Non-Brittle Intermetallics," Midwest Forensics Resource Center, http://www.external.ameslab.gov/news/release/2003rel/ductile.htm , Sep. 15, 2003, pp. 1-2.

(Continued)

*Primary Examiner*—Minh-Loan Tran
(74) *Attorney, Agent, or Firm*—Lisa U. Jaklitsch; Hoffman, Warnick & D'Alessandro LLC

(57) ABSTRACT

Methods of forming a conductive structure on a substrate prior to packaging, and a test probe structure generated according to the method, are disclosed. The conductive structure includes a high aspect ratio structure formed by injected molded solder. The invention can be applied to form passive elements and interconnects on a conventional semiconductor substrate after the typical BEOL, and prior to packaging. The method may provide better electromigration characteristics, lower resistivity, and higher Q factors for conductive structures. In addition, the method is backwardly compatible and customizable.

17 Claims, 7 Drawing Sheets

OTHER PUBLICATIONS

IBM Research, "Injection Molded Soldering," http://www.research.ibm.com/ims/Oct. 15, 2004, pp. 1-3.

Geheim, G. et al, "Deep RIE Process for Silicon Carbide Power Electronics and MEMS," Materials Research Society Symposium Proceedings, vol. 622, 2000, pp. 1-6.

"High Aspect Ratio Etching," http://www.protron-mikrotechnik.de/technology/technology_ase_e_2.htm Nov. 3, 2004, pp. 1-2.

"Central Fabrication Facility: Deep Silicon RIE," NMRC, http://www.nmrc.ie/facilities/cff/mic_sys_rie.html, Sep. 29, 2004, pp. 1-2.

* cited by examiner

FORMING OF HIGH ASPECT RATIO CONDUCTIVE STRUCTURE USING INJECTION MOLDED SOLDER

BACKGROUND OF THE INVENTION

1. Technical Field

The present invention relates generally to a method of forming conductive structures on a substrate and more particularly, relates to forming conductive structures by injection molded solder.

2. Related Art

In the semiconductor industry, it is conventional to generate electrically conductive structures on a semiconductor chip packaging substrate such as wire bond interconnects for packaging, and other passive elements such as inductors, capacitors, coils, transformers, baluns (i.e., a transformer for matching an unbalanced line to a balanced load), antennae and redistributions (i.e., another layer of interconnect for signals or power lines).

Injection molded soldering (IMS) is a flip chip bumping technology developed to reduce wafer bumping costs by reducing process steps. See, for example, U.S. Pat. No. 6,133,633 to Berger et al., which illustrates one approach for building interconnect structures using IMS. The process of IMS melts bulk material, usually solder, and dispenses it onto a wafer-sized mold which is coefficient of thermal expansion (CTE) matched to the device substrate. The mold is scanned with the molten material and thereafter cooled so that the material solidifies. An illustrative mold 10 is shown in FIG. 1. It can then be inspected and aligned to the substrate. The aligned assembly is then heated in order to transfer the bumps from the mold to the substrate. When the material is in a liquid state and the corresponding structures are oxide free, the wetting forces exceed the surface tension forces that maintain the molten material in the mold. After cooling to solidify the material it is released from the mold as it is removed from the substrate. The structures retain the shape of the mold. The molds are reusable.

One shortcoming of the above-described IMS approach, however, is that it is limited to low aspect ratio interconnects, i.e., with an aspect ratio of less than 3:1. For example, as shown in FIG. 1, the openings in mold 10 have a low aspect ratio. Ideally, passive elements should be generated with as high an aspect ratio as possible to provide the highest performance with the minimal space usage.

In view of the foregoing, there is a need in the art for a way to form conductive structures on a substrate that does not suffer from the problems of the related art.

SUMMARY OF THE INVENTION

This invention includes methods of forming a conductive structure on a substrate prior to packaging, and a test probe structure generated according to the method. The conductive structure includes a high aspect ratio structure formed by injected molded solder. The invention can be applied to form passive elements and interconnects on a conventional semiconductor substrate after the typical BEOL, and prior to packaging. The method may provide better electromigration characteristics, lower resistivity, and higher Q factors for conductive structures. In addition, the method is backwardly compatible and customizable.

A first aspect of the invention is directed to a method of forming a conductive structure on a substrate prior to packaging, the method comprising the steps of: providing a mold having at least one high aspect ratio (AR) opening formed therein; filling each high AR opening with a molten solder; cooling the molten solder to form a conductive structure in the high AR opening; aligning the high AR opening in the mold to a preselected site of the substrate; heating to cause the conductive structure to flow to the preselected site of the substrate; cooling to solidify the conductive structure on the preselected site of the substrate; and removing the mold.

A second aspect is directed to a method of forming a conductive structure on a substrate, the method comprising the steps of: providing a mold having at least one high aspect ratio (AR) opening formed therein, each high AR opening having substantially vertical sidewalls and a bottom; filling each high AR opening with a molten solder; cooling the molten solder to form a conductive structure in the high AR opening; aligning the high AR opening in the mold to a preselected site of the substrate; heating to cause the conductive structure to flow to the preselected site of the substrate; cooling to solidify the conductive structure on the preselected site of the substrate; and removing the mold.

A third aspect of the invention is directed to a ball grid array (BGA) test structure for use on a semiconductor chip, the test structure comprising: a test probe for each ball of the BGA, each test probe including a receptor end that is conformal to a ball of the ball grid array and a high aspect ratio body electrically connected to test circuitry.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

With reference to FIGS. 2-6, a method of forming a conductive structure 130 (FIGS. 4-6) on a substrate 142 (FIG. 6) prior to packaging using injected molded solder will now be described. It should be recognized that FIGS. 2-6 illustrate formation of just one particular conductive structure 130 (FIG. 6) according to the invention, and that the invention is applicable to a variety of different structures as will be described below. In particular, in FIGS. 2-6, each conductive structure 130 forms a test probe 160 (FIG. 7) for a ball grid array (BGA) 172 (FIG. 7). As will be described below, however, conductive structures may include any of a variety of passive elements such as an inductor, a transformer, a capacitor, a coil, a balun, an antenna and a redistribution; interconnects such as balls of a ball grid array; and/or other conductive structures.

Figure 1:
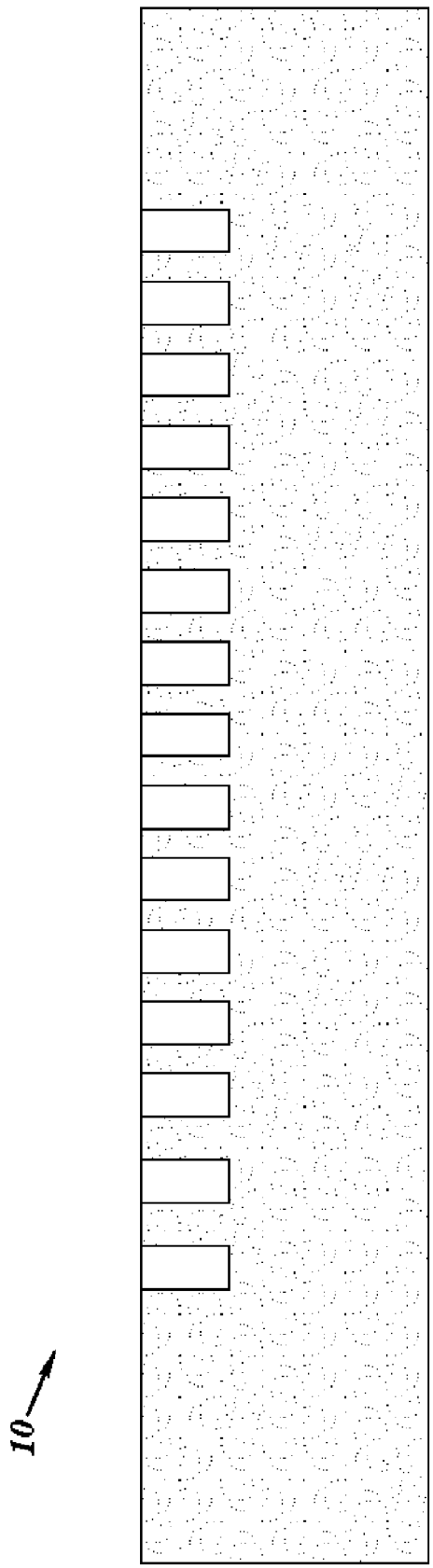
FIG. 1 shows a conventional injection molded solder mold.
Figure 2:
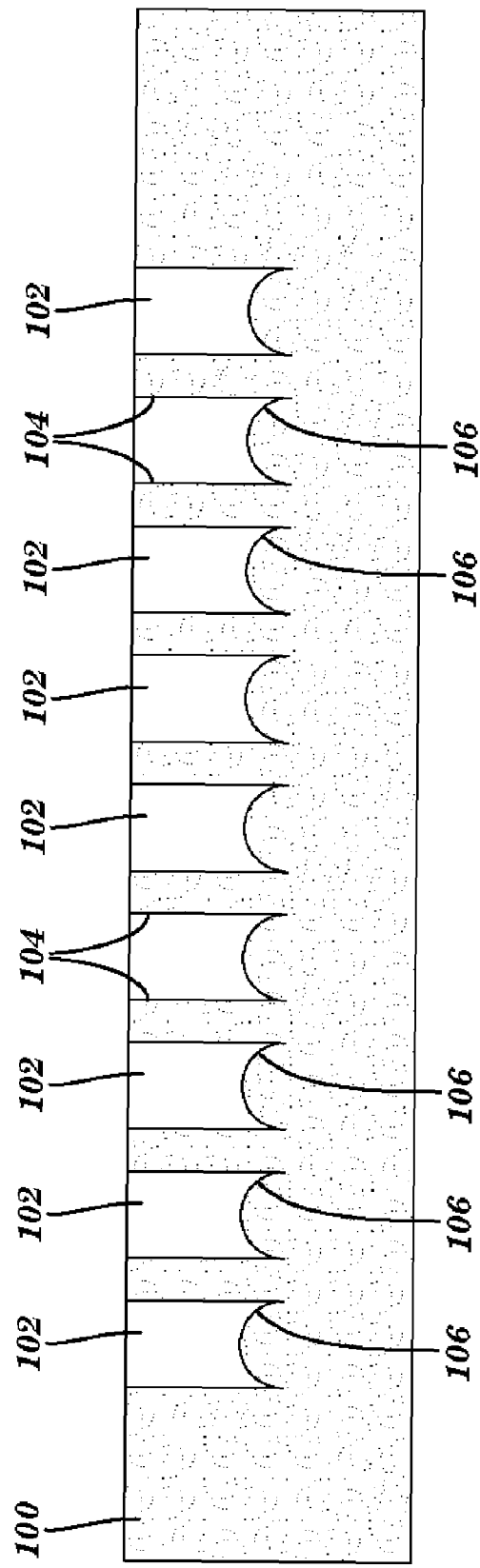
FIGS. 2-6 show cross-sectional views of a method according to one embodiment of the invention.

Turning to the method, FIG. 2 shows an initial step of providing a mold 100 having at least one high aspect ratio (AR) opening 102 formed therein. "High AR" as used herein means having a height to width greater than 3:1. Each high AR opening 102 includes substantially vertical sidewalls 104 and a bottom 106. No re-entrant features are provided since this would lock conductive structure 130 (FIGS. 4-6) in mold 100. As shown, openings 102 are substantially cylindrical, although this is not necessary. Depending on the purpose of the conductive structure, bottoms 106 of each high AR opening 102 may be non-planar. In the case of the test probe structure illustrated, each bottom 106 is shaped to be substantially conformal to the features to be tested, e.g., cupped to receive a ball of a BGA. Although not shown, it should be recognized that openings 102 can be of different aspect ratios to form conductive structures of different heights. For example, test probes of different heights may be generated that are able to test structures that have substantially different heights.

Figure 3:
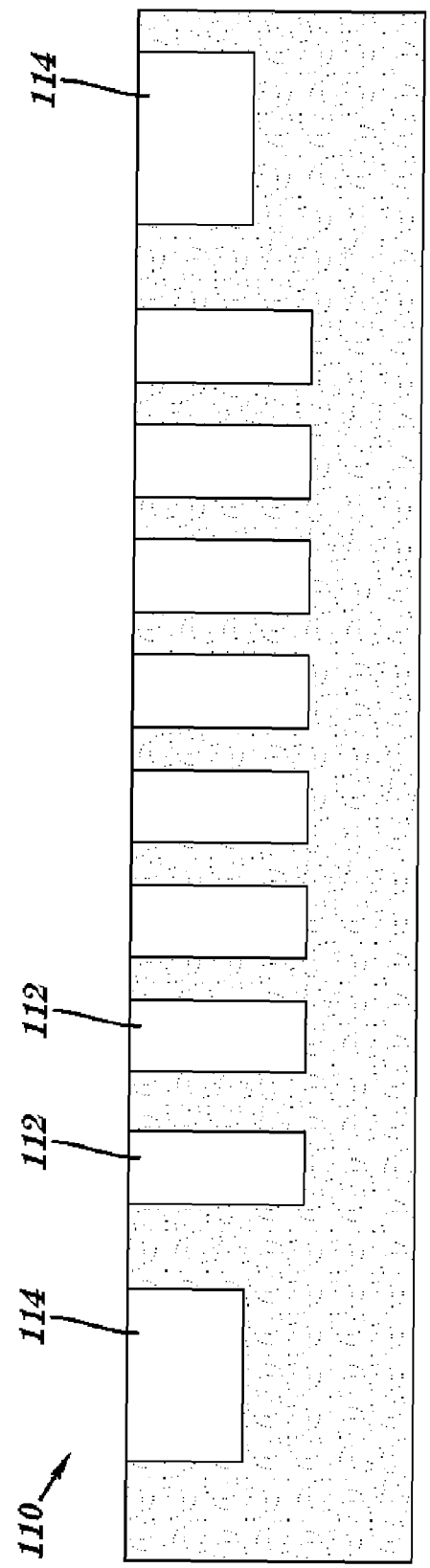

Each mold 100 preferably has a coefficient of thermal expansion (CTE) substantially equivalent to a CTE of a substrate 142 (FIG. 5) to which the mold will be applied. Mold 100 may be formed of any material meeting the preferred CTE standard. In one embodiment, a mold 100 includes silicon or graphite, however, this is not necessary. Graphite is advantageous since it provides excellent release of structure formed therein, allowing aspect ratios as high as 10:1. FIG. 3 shows an alternative embodiment of a mold 110. As illustrated in FIG. 3, mold 110 may include high AR openings 112 for forming, for example, passive elements, and low-aspect ratio openings 114 for forming interconnects, i.e., having a height to width less than 3:1. Openings 102 (FIG. 2), 112,114 may be formed by any conventional format. For example, for silicon molds, the openings can be patterned and etched. In one embodiment, new deep silicon reactive ion etching (RIE) processes are preferred since they allow formation high aspect ratio structures with straight sidewalls in silicon. For non-planar bottoms 106 (FIG. 2), the bottoms may be formed as well-known RIE artifacts, microtrenching.

Figure 4:
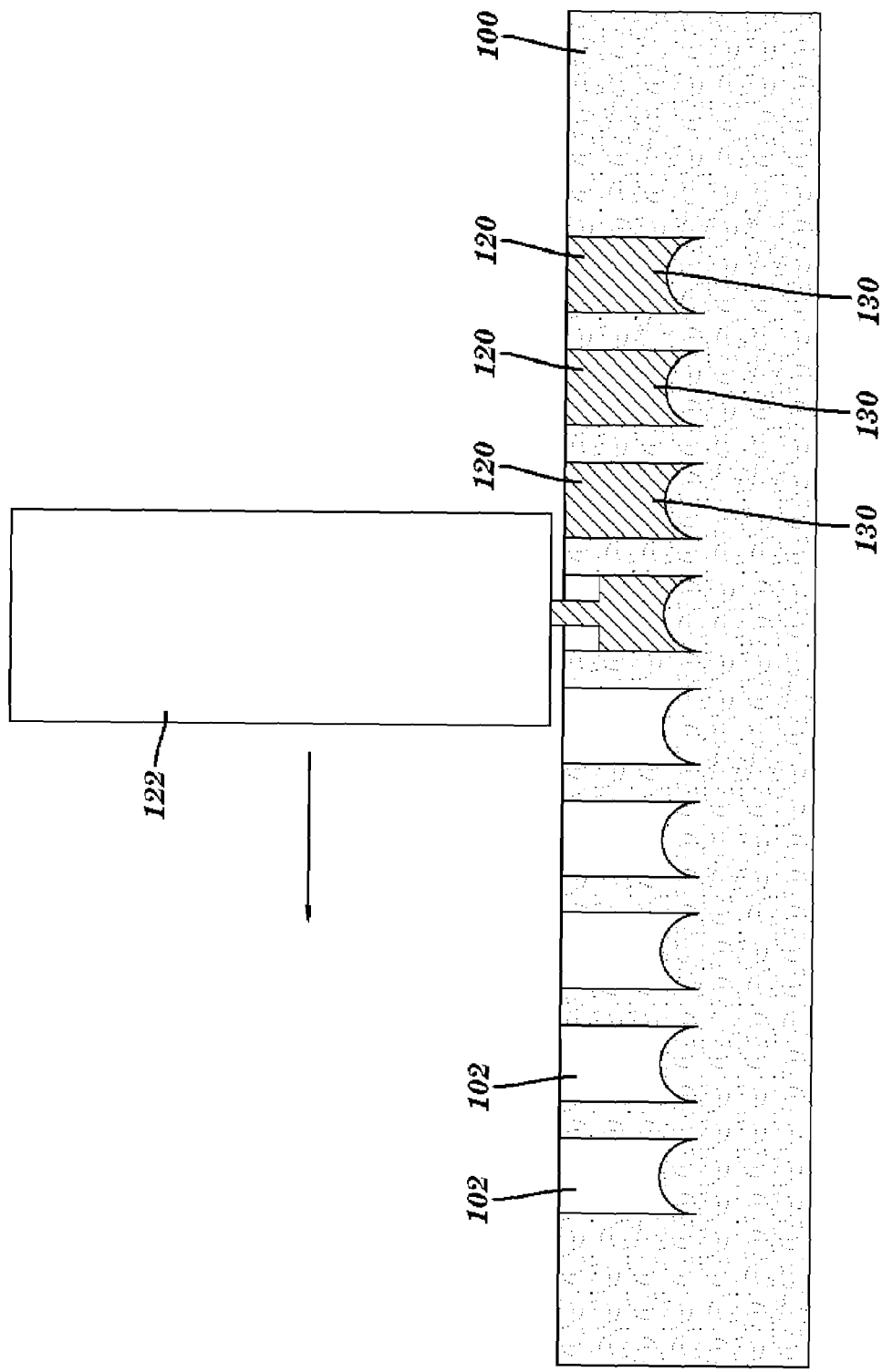

FIG. 4 shows a next step of the method including filling each high AR opening 102 with a molten solder 120. The filling may be conducted using a conventional injection molten solder dispenser 122 such as that disclosed in U.S. Pat. No. 6,461,136 to Gruber et al., which is hereby incorporated by reference, or by other conventional processes such as wave solder techniques. Where conductive structure 130 is to be an interconnect, molten solder 120 may include any now known or later developed interconnect material. Where conductive structure 130 is to be a passive element, molten solder 120 preferably includes an intermettalic material such as yttrium-silver(YAg), yttrium-copper(YCu), dysprosium-copper (DyCu), cerium-silver (CeAg), erbium-silver(ErAg), erbium-gold (ErAu), erbium-copper (ErCu), erbium-iridium (ErIr), holmium-copper (HoCu), neodymium-silver (NdAg), yttrium-indium (YIn) and yttrium-rhodium (YRh). These intermettalic alloys have been found advantageous because they are ductile at room temperature. Next, molten solder 120 is allowed to cool to form a conductive structure 130 in high AR opening 102.

Figure 5:
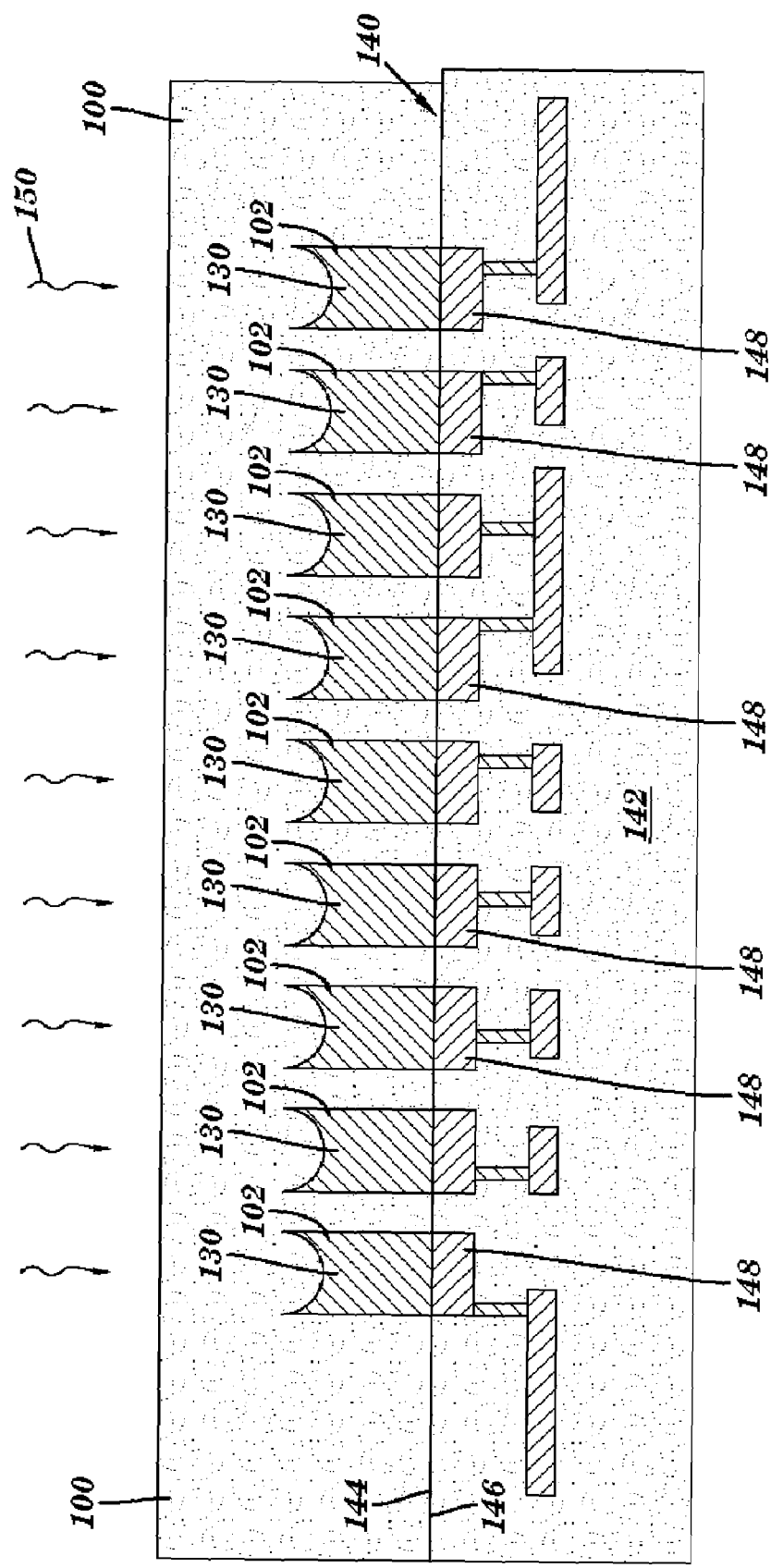

Turning to FIG. 5, high AR opening 102 in mold 100 is aligned to a preselected site 140 of a substrate 142 to which conductive structure 130 is to be applied. Although not necessary, preselected site 140 may include wettable alloy receiving structures 148 to which conductive structure 130 is to electrically attach. This step may also include removing any oxidation (not shown) from preselected site 140 prior to the next step. In addition, as shown, the aligning step may include bringing a surface 144 of mold 100 into contact with a surface 146 of substrate 142. However, this may not be necessary for all conductive structures.

In the next steps, also shown in FIG. 5, conductive structure 130 is heated 150 to cause it to flow to preselected site 140 of substrate 142, and then allowed to cool, e.g., either by natural heat transfer or by coolant being applied thereto, on preselected site 140 of substrate 142.

Figure 6:
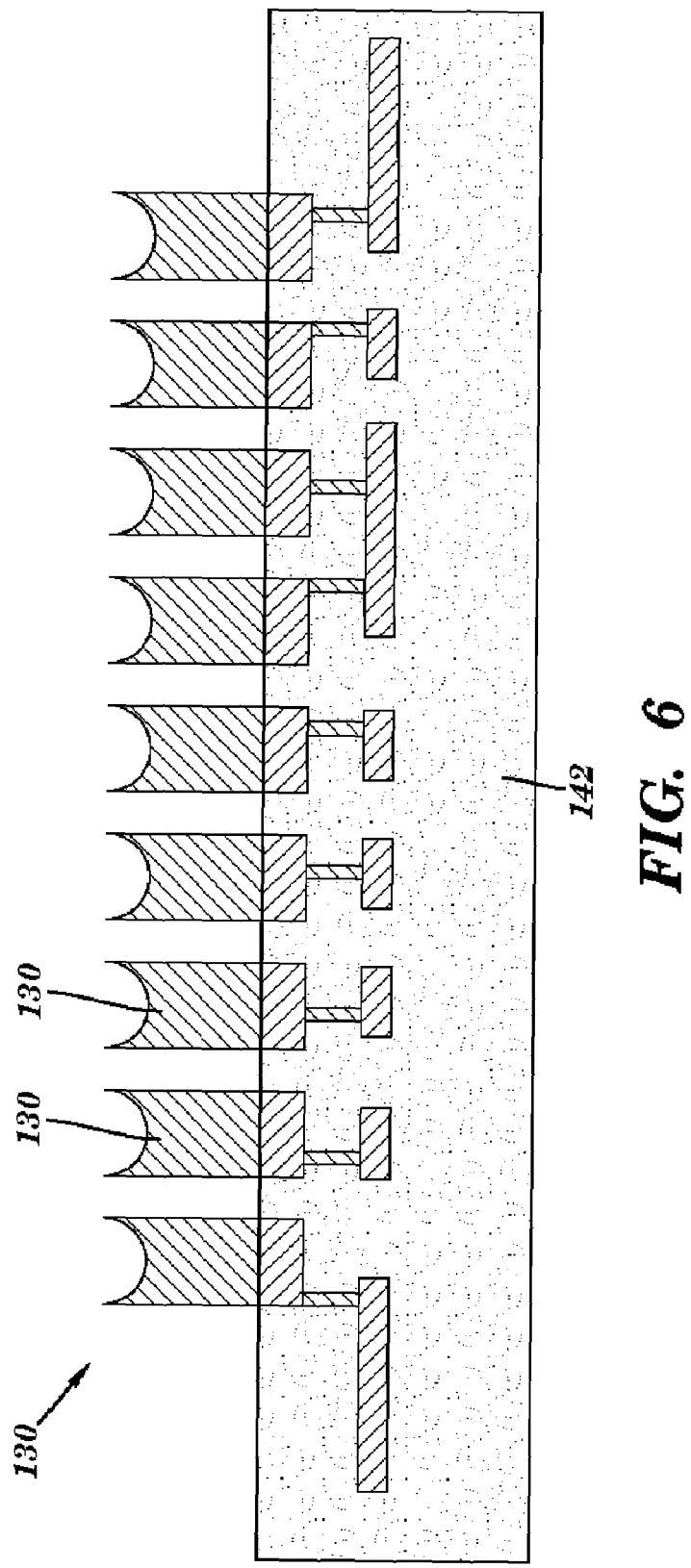
Figure 7:
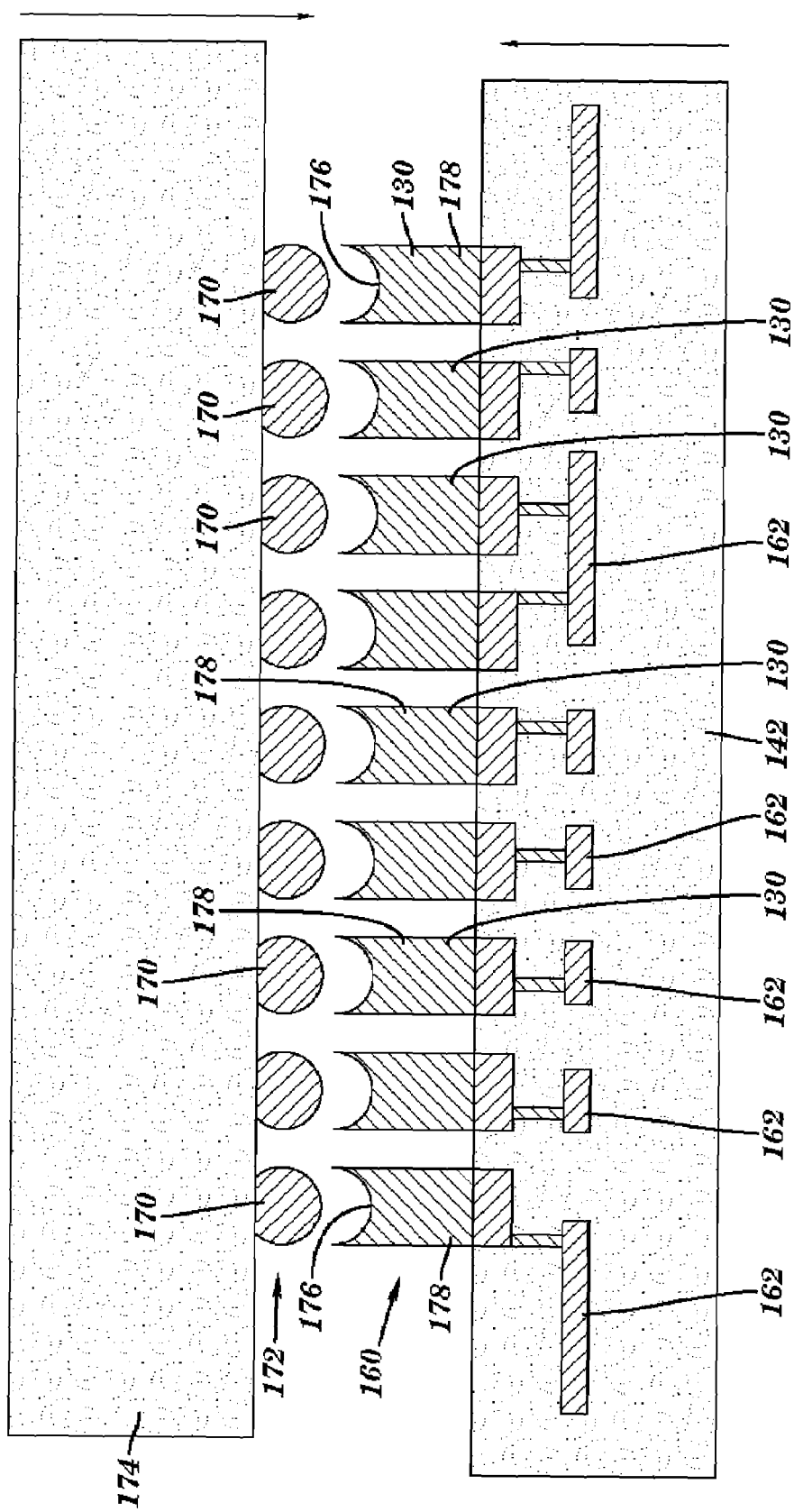
FIG. 7 shows a cross-sectional view of a one application of the method of FIGS. 2-6 to form a test structure.

As shown in FIG. 6, the mold is then removed to form conductive structure 130 on substrate 142. The mold is then re-usable to form more conductive structures 130. As shown in FIG. 7, conductive structures 130 as illustrated, form a ball grid array (BGA) test structure 160 for use on a semiconductor chip 174. In this case, substrate 142 includes any now known or later developed test circuitry 162. In one embodiment, test structure 160 includes a test probe 130 (i.e., conductive structure) for each ball 170 of a BGA 172. Each test probe 130 includes a receptor end 176 that is substantially conformal to a ball 170 and a high aspect ratio body 178 electrically connected to test circuitry 162. The above-described test structure 160 allows wafer scale circuit testing on bumped wafers, rather than conventional sequential testing. As a result, substrates finished with controlled collapse chip connections (C4) or any other ball array can be probed all at once instead of chip-by-chip. Where necessary, each test probe 130 may have a different aspect ratio (i.e., height) so testing of structures such as C4, which typically suffer from non-planarity of connects, can be tested without probe damage.

Where necessary, subsequent processing (not shown) may include encasing conductive structure 130 in polymer as part of conventional packaging.

The above-described method provides a mechanism to: maintain consistent composition of alloys, and quickly form complex three-dimensional form factors that are compatible with lead (Pb) free alloys, and is applicable to damascene/dual damascene and high aspect ratio structures. In addition, the method readily accommodates alloys of various melting points lending to a temperature hierarchy for construction of complex packages with the ability to make multiple aspect ratio structures at the same time.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a conductive structure on a substrate prior to packaging, the method comprising:
   providing a mold having at least one high aspect ratio (AR) opening formed therein, the at least one high AR being greater than 3:1, wherein the at least one high AR opening includes a non-planar bottom;
   filling each high AR opening with a molten solder;
   cooling the molten solder to form a conductive structure in the high AR opening;
   aligning the high AR opening in the mold to a preselected site of the substrate;
   heating to cause the conductive structure to flow to the preselected site of the substrate;
   cooling to solidify the conductive structure on the preselected site of the substrate; and
   removing the mold.

2. The method of claim 1, wherein the mold has a coefficient of thermal expansion substantially equivalent to a coefficient of thermal expansion of the substrate.

3. The method of claim 1, further comprising of removing any oxidation from the preselected site prior to the heating.

4. The method of claim 1, wherein the mold is re-usable.

5. The method of claim 1, wherein the non-planar bottom forms a distal end of the structure from the substrate.

6. The method of claim 1, wherein the aligning includes bringing a surface of the mold into contact with a surface of the substrate.

7. The method of claim 1, wherein the solder includes an intermettalic material.

8. The method of claim 7, wherein the intermetallic material includes at least one of the group consisting of: yttrium-silver(YAg), yttrium-copper(YCu), dysprosium-copper (DyCu), cerium-silver (CeAg), erbium-silver(ErAg), erbium-gold (ErAu), erbium-copper (ErCu), erbium-iridium (ErIr), holmium-copper (HoCu), neodymium-silver (NdAg), yttrium-indium (YIn) and yttrium-rhodium (YRh).

9. The method of claim 1, wherein the conductive structure forms at least one of: an inductor, a transformer, a capacitor, a coil, a balun, an antenna and a redistribution.

10. The method of claim 1, wherein each high AR opening has substantially vertical sidewalls and a bottom.

11. The method of claim 1, wherein the mold further includes at least one low aspect ratio opening.

12. A method of forming a conductive structure on a substrate, the method comprising:
   providing a mold having at least one high aspect ratio (AR) opening formed therein, the at least one high AR being greater than 3:1, each high AR opening having substantially vertical sidewalls and a bottom, the bottom being non-planar;
   filling each high AR opening with a molten solder;
   cooling the molten solder to form a conductive structure in the high AR opening;
   aligning the high AR opening in the mold to a preselected site of the substrate;
   heating to cause the conductive structure to flow to the preselected site of the substrate;
   cooling to solidify the conductive structure on the preselected site of the substrate; and
   removing the mold.

13. The method of claim 12, wherein the mold has a coefficient of thermal expansion substantially equivalent to a coefficient of thermal expansion of the substrate.

14. The method of claim 12, further comprising removing any oxidation from the preselected site prior to the heating.

15. The method of claim 12, wherein the bottom of each opening is non-planar.

16. The method of claim 12, wherein the solder includes an intermettalic material including at least one of the group consisting of: yttrium-silver(YAg), yttrium-copper(YCu), dysprosium-copper (DyCu), cerium-silver (CeAg), erbium-silver(ErAg), erbium-gold (ErAu), erbium-copper (ErCu), erbium-iridium (ErIr), holmium-copper (HoCu), neodymium-silver (NdAg), yttrium-indium (YIn) and yttrium-rhodium (YRh).

17. The method of claim 12, wherein the mold includes one of silicon and graphite.

* * * * *